(12) United States Patent
Faure et al.

(10) Patent No.: US 7,256,473 B2
(45) Date of Patent: Aug. 14, 2007

(54) COMPOSITE STRUCTURE WITH HIGH HEAT DISSIPATION

(75) Inventors: Bruce Faure, Grenoble (FR); Alice Boussagol, Bernin (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 0 days.

(21) Appl. No.: 11/539,310

(22) Filed: Oct. 6, 2006

(65) Prior Publication Data

US 2007/0080372 A1 Apr. 12, 2007

Related U.S. Application Data

(62) Division of application No. 11/020,040, filed on Dec. 21, 2004, now Pat. No. 7,135,383.

(30) Foreign Application Priority Data

Oct. 29, 2004 (FR) .................................. 04 11579

(51) Int. Cl.
*H01L 21/4763* (2006.01)
(52) U.S. Cl. .................. 257/618; 257/98; 257/432; 257/E21.527
(58) Field of Classification Search ............... 257/618, 257/98, 432
See application file for complete search history.

(56) References Cited

U.S. PATENT DOCUMENTS

| | | | |
|---|---|---|---|
| 6,326,279 B1 | 12/2001 | Kakizaki et al. | 438/406 |
| 6,328,796 B1 | 12/2001 | Kub et al. | 117/94 |
| 6,497,763 B2 | 12/2002 | Kub et al. | 117/94 |
| 6,617,060 B2 | 9/2003 | Weeks, Jr. et al. | 428/698 |
| 6,812,067 B2* | 11/2004 | Chen et al. | 438/122 |
| 2002/0096106 A1* | 7/2002 | Kub et al. | 117/94 |
| 2003/0025198 A1 | 2/2003 | Chrysler et al. | 257/713 |
| 2003/0064535 A1 | 4/2003 | Kub et al. | 438/22 |
| 2003/0064735 A1 | 4/2003 | Spain et al. | 455/456 |
| 2003/0136333 A1 | 7/2003 | Semond et al. | 117/95 |
| 2003/0178637 A1* | 9/2003 | Chen et al. | 257/189 |
| 2003/0219959 A1 | 11/2003 | Ghyselen et al. | 438/458 |
| 2004/0053477 A1 | 3/2004 | Ghyselen et al. | 438/465 |
| 2004/0178448 A1 | 9/2004 | Rayssac et al. | 257/347 |

OTHER PUBLICATIONS

J.-P. Colinge, Silicon-on-Insulator Technology: Materials to VLSI 2nd Edition, Kluwer Academic Publishers, 50-51 (1997).

* cited by examiner

*Primary Examiner*—Asok K. Sarkar
*Assistant Examiner*—Victor V. Yevsikov
(74) *Attorney, Agent, or Firm*—Winston & Strawn LLP

(57) ABSTRACT

A composite structure is disclosed that includes a support wafer and a layered structure on the support wafer. The layered structure includes at least one layer of a monocrystalline material and at least one layer of a dielectric material. In addition, the layered structure materials and the thickness of each layer are chosen such that the thermal impedance between ambient temperature and 600° K of the composite structure is a value that is no greater than about 1.3 times the thermal impedance of a monocrystalline bulk SiC wafer having the same dimensions as the composite structure. The composite structure provides sufficient heat dissipation properties for manufacturing optical, electronic, or optoelectronic components.

16 Claims, 3 Drawing Sheets

COMPOSITE STRUCTURE WITH HIGH HEAT DISSIPATION

CROSS-REFERENCE TO RELATED APPLICATIONS

This application is a division of application Ser. No. 11/020,040 filed Dec. 21, 2004 now U.S. Pat. No. 7,135,383, the entire content of which is expressly incorporated herein by reference thereto.

BACKGROUND OF THE INVENTION

1. Technical Field

This invention relates to a composite structure suitable for use in optical, optoelectronic or electronic applications. The structure includes a support wafer and a layered structure having at least one layer made of a material chosen from among monocrystalline materials. The composite structure is capable of dissipating heat caused by the operation of optical, electrical, or optoelectrical components.

2. Background Art

Dissipation of heat released by components in a useful layer becomes a critical problem when the operating frequencies of these components and/or their degree of miniaturization increases For example, in a CMOS application, the miniaturization of components and a reduced thickness useful layer exacerbates heat dissipation problems, particularly in cases wherein the useful layers are more or less thermally separated from a support substrate on which they were formed. In particular, CMOS components made as SOI (Silicon-On-Insulator), SiGeOI (SiGe-On-Insulator), GeOI (Ge-On-Insulator) or SGOI (Si/SiGe-On-Insulator) structures can be problematic as the temperature rises (which causes disturbances in the behavior of components). This is due to the fact that the oxide layer (which typically forms the insulating layer for these structures) forms a thermal barrier between a substrate and the useful layer. This type of SOI, SiGeOI, SGOI, GeOI structure may be fabricated by using a SMART-CUT® process, as described in U.S. Patent Publication No. 2004/0053477.

Components operating at a high power frequency (typically more than 900 MHz) can also cause temperature increases that could disturb or even damage them. To overcome this disadvantage, useful layers are typically made of a nitride semiconductor material with better charge carrying properties (high saturation rate of carriers at high voltage, high breakdown voltage, etc.) than materials such as AsGa. Such useful layers are used for High Electron Mobility Transistor (HEMT) type components. To form such nitride semiconductor-based layers, growth supports made of monocrystalline bulk SiC, bulk <111> Si, or bulk sapphire ($Al_2O_3$) are used, for which the lattice parameters are very similar to the lattice parameters of monocrystalline bulk <100> silicon. However, the thermal impedance properties of <111> Si and sapphire are still too high for some high power frequency applications that require greater dissipation of released heat, and although monocrystalline bulk SiC is generally used as a reference material concerning heat dissipation, this material is currently still too expensive to be practical.

U.S. Pat. No. 6,328,796 and U.S. Published application no. 2003/0064735 disclose composite structures made by bonding thin layers to support wafers. The support wafers are made of polycrystalline materials chosen for their thermal, electrical conductivity and thermal expansion properties (such as polycrystalline SiC substrates). A bonding layer made of a dielectric material is included that functions to improve the bond between the thin layer and the support wafer and to encourage the appearance of possible compliance phenomena. However, the materials and dimensions of the different layers and support wafers, and the methods of manufacturing the structure, are chosen to satisfy physical specifications such as thermal conduction, electrical conduction and thermal expansion. In order to satisfy these various specifications, a structure is chosen as a compromise solution, and it cannot give complete satisfaction. Therefore, the described composite structures are not optimized for high power frequency applications that require strong thermal dissipation properties.

SUMMARY OF THE INVENTION

The invention is a composite structure with good thermal dissipation properties, and it can be manufactured for lower cost than a structure made of monocrystalline bulk SiC. The composite structure can also be made in sizes larger than 3 inches. The invention also provides for improved operation of miniaturized HEMT or CMOS components at a low cost. A structure is thus provided that has good thermal conductivity and semi-insulating electrical characteristics (i.e. it is highly resistive) and that is suitable for HEMT applications.

In a preferred embodiment, a composite structure includes a support wafer and a layered structure on the support wafer. The layered structure includes at least one layer of a monocrystalline material and at least one layer of a dielectric material. In addition, the layered structure materials and the thickness of each layer are chosen such that the thermal impedance between ambient temperature and 600° K of the composite structure is a value that is no greater than about 1.3 times the thermal impedance of a monocrystalline bulk SiC wafer having the same dimensions as the composite structure. Sufficient heat dissipation properties are provided to allow use of the composite structure for manufacturing optical, electronic, or optoelectronic components.

In a beneficial implementation, the support wafer material has a significantly lower thermal impedance than the thermal impedance of monocrystalline bulk silicon and has an electrical resistivity of more than about $10^4$ ohms-cm. The support wafer may be made of at least one of polycrystalline bulk SiC, polycrystalline bulk AlN, or a ceramic material. In an advantageous implementation, the layered structure includes at least one layer of a dielectric material of $SiO_2$, $Si_3N_4$, or $Si_xO_yN_z$. The layered structure may also include at least one layer of a monocrystalline material and at least one layer of a dielectric material, wherein the dielectric material has a maximum thickness of about 0.2 micrometer, and wherein the monocrystalline material layer has a threshold thickness which is a function of the dielectric material layer thickness. Alternately, the layered structure may include at least one layer of a monocrystalline material and at least one layer of a dielectric material, wherein the dielectric material has a thickness of about 0.02 to 0.2 micrometer, and the monocrystalline material layer has a threshold thickness of from about 0.06 to 1 micrometer. In a beneficial implementation, the monocrystalline layer material is a semiconductor material suitable for fabricating at least one electronic component formed therein or comprises at least one CMOS type electronic component and the monocrystalline material is at least one of Si, SiGe, or Ge. The substrate may have an electrical resistivity of more than about $10^4$ ohms-cm and the material of the monocrystalline material layer comprises at least one of SiC, or <111> Si, or GaN and accommodates growth of a monocrystalline nitride semiconductor thereon.

In an advantageous embodiment, the support wafer is made of polycrystalline SiC, the monocrystalline material layer is made of <111> Si and the dielectric material layer is made of SiO$_2$. In a variant, the structure includes an epitaxial layer made of monocrystalline GaN suitable for use in HEMT applications.

In another aspect according to the invention, a hybrid structure is provided that is suitable for use as a substrate for the crystalline growth of a nitride semiconductor. The hybrid structure includes a support wafer, a layered structure on the support wafer to form a composite structure, and a monocrystalline upper structure formed on a free surface of the monocrystalline material layer, wherein the material of the upper structure is suitable for forming a high quality nitride semiconductor layer thereon. In this implementation, the layered structure includes at least one monocrystalline material layer and at least one dielectric material layer, and the layered structure materials and the thickness of each material layer are chosen such that the thermal impedance between ambient temperature and 600° K of the composite structure is no greater than about 1.3 times the thermal impedance of a monocrystalline bulk SiC wafer with the same dimensions as the composite structure.

In beneficial embodiments, the layered structure includes at least one layer of a monocrystalline material made of at least one of SiC, <111> Si, or GaN, and the upper structure includes a layer made of at least one of the following alloys: $Al_xIn_yGa_{(1-x-y)}N$, or $In_yGa_{(1-y)}N$, or $Al_xGa_{(1-x)}N$ where $0 \leq x \leq 1$ and $0 \leq y \leq 1$. In addition, the concentration of at least one of the alloy elements of the material of the upper structure varies progressively through the thickness of the monocrystalline material. Advantageously, the hybrid structure may further include an epitaxial layer made of monocrystalline GaN suitable for use in HEMT applications.

Yet another aspect according to the invention pertains to a process for manufacturing a composite structure. The method includes bonding a support wafer to a donor wafer, and processing the donor wafer to remove a portion of the donor wafer and provide a remainder structure on the support wafer to form the composite structure. The donor wafer includes a layered structure comprising at least one monocrystalline material layer and at least one dielectric material layer as a surface layer that contacts the support wafer. In addition, the composite structure includes the at least one monocrystalline material layer and the at least one dielectric material layer, and has characteristics and a thickness such that the thermal impedance between ambient temperature and 600° K of the composite structure is no greater than about 1.3 times the thermal impedance of a monocrystalline bulk SiC wafer with the same dimensions as the composite structure. A composite structure manufactured in this manner provides sufficient heat dissipation properties to allow the manufacture of optical, electronic, or optoelectronic components.

An advantageous embodiment further includes choosing a bulk material for the support wafer that has a thermal impedance between ambient temperature and 600° K that is significantly less than the thermal impedance of monocrystalline bulk silicon, and choosing the support wafer to be made of at least one of polycrystalline bulk SiC, or polycrystalline bulk AlN, or ceramic. The surface layer of the donor wafer includes a bonding layer made of dielectric material wherein the bonding layer contacts the support substrate. A beneficial implementation also includes, prior to bonding, implanting atomic species under the surface of the donor wafer at a predetermined depth to form a zone of weakness, and the processing results in detaching the remainder structure from the donor wafer at the zone of weakness. In an advantageous variant, the donor wafer is made of monocrystalline bulk Si, monocrystalline bulk Ge, or monocrystalline bulk SiC, and further, prior to bonding, the layered structure is formed by growing at least one crystalline layer of monocrystalline material on a growth substrate, wherein the growth substrate comprises at least one of bulk Si or bulk Ge and a buffer layer made of SiGe, and wherein the layer made of monocrystalline material is at least one of <100> Si or SiGe, or the growth substrate includes at least one of bulk sapphire (Al$_2$O$_3$), monocrystalline bulk SiC, bulk ZnO, or bulk <111> Si, and the layer made of monocrystalline material is made of at least one of SiC, <111> Si, GaN, AlN, InN, $Al_xIn_yGa_{(1-x-y)}N$, $In_yGa_{(1-y)}N$, or $Al_xGa_{1-x}N$ where $0 \leq x \leq 1$ and $0 \leq y \leq 1$.

Another advantageous variant further includes growing a monocrystalline upper structure on the monocrystalline material layer suitable for forming a nitride semiconductor layer of higher quality than one formed directly on the monocrystalline material layer, wherein the upper structure is made of at least one of the following alloys: $Al_xIn_yGa_{(1-x-y)}N$, $In_yGa_{(1-y)}N$, or $Al_x Ga_{(1-x)}N$ where $0 \leq x \leq 1$ and $0 \leq y \leq 1$. Advantageously, the concentration of at least one of the elements in the alloy of the upper structure varies progressively through the thickness of the upper structure.

Other characteristics, purposes and advantages of the invention will become clearer after reading the following detailed description of the invention, given as a non-limitative example with reference to the appended figures.

BRIEF DESCRIPTION OF THE DRAWINGS

Other aspects, purposes and advantages of the invention will become clear after reading the following detailed description with reference to the attached drawings, in which.

Like reference numbers in the various drawings indicate like elements.

DETAILED DESCRIPTION OF THE PREFERRED EMBODIMENTS

Figure 1:
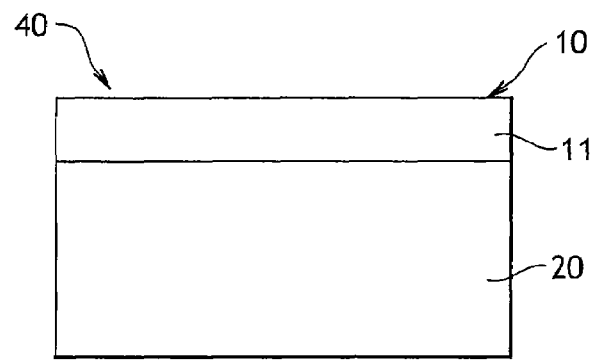
FIG. 1 shows a first composite structure according to the invention.

A composite structure suitable for optics, optoelectronics or electronics applications is described herein. The composite structure includes a support wafer and a layered structure made of one or more layers of monocrystalline materials and one or more layers of dielectric material. In a preferred embodiment, there is provided a layered structure of one monocrystalline material layer and one dielectric material layer. The materials from which the support wafer is made, and the layer or layers of monocrystalline material and dielectric are chosen, and the thickness of each layer is adjusted, such that the thermal impedance between ambient temperature and 600° K of the composite structure is less than or equal to about 1.3 times the thermal impedance of a monocrystalline bulk SiC wafer with the same dimensions as the composite structure.

Note that the thermal impedance of a structure $\phi$ is calculated from the thermal resistivities $R_i$ of the different layers i of the structure ($\phi=1/\Sigma_i R_i$). The thermal resistivity of a material is defined by its increase in ° C., or in ° K, over a 1 square meter surface area (the surface area of the layer or substrate considered) per input power in Watts. The thermal resistivity is also equal to the ratio between the thickness of the layer (or the substrate) considered, and the thermal conductivity of the material used.

According to a second aspect, a hybrid structure is described in detail herein that includes the composite structure and an upper monocrystalline structure on top of the monocrystalline material layer. The material(s) forming the upper structure are adapted to make the quality of a nitride semiconductor layer to be formed on the hybrid structure better than the case in which the nitride semiconductor layer is formed directly on the monocrystalline material layer.

According to a third aspect, a structure for use in HEMT applications is provided. This structure includes the composite structure or the hybrid structure, and an epitaxial layer made of monocrystalline GaN.

According to a fourth aspect, a process for manufacturing a composite structure is described below. The process includes using a monocrystalline material donor wafer, bonding a support wafer to the donor wafer, and reducing the donor wafer to leave a remainder structure on the support wafer. The composite structure includes the monocrystalline material in the form of a layer, the nature and thickness of the material being such that the thermal impedance between ambient temperature and 600° K of the composite structure is less than or equal to about 1.3 times the thermal impedance of a monocrystalline bulk SiC wafer with the same dimensions as the composite structure. A variation includes forming a bonding layer made of a dielectric material between the support wafer and the donor wafer, such that the thickness of the bonding layer is less than a maximum thickness above which the thermal impedance between ambient temperature and 600° K of the composite structure less than or equal to about 1.3 times the thermal impedance of a wafer of monocrystalline bulk SiC with the same dimensions as the composite structure.

According to a fifth aspect, provided is a process for manufacturing a hybrid structure. This process includes production of a composite structure as described above, and then using a crystalline growth process to grow an upper monocrystalline structure on the monocrystalline material layer. The configuration of the upper structure and the materials from which it is composed enable fabrication of a nitride semiconductor layer with a better quality than would have been possible if the nitride semiconductor were fabricated directly on the monocrystalline material layer.

Preferably, the layered structure materials and the thickness of each layer are chosen such that the thermal impedance between ambient temperature and 600° K of the composite structure is a value that is as close as possible to the thermal impedance of a monocrystalline bulk SiC wafer having the same dimensions as the composite structure. This value can preferably vary between 1 and about 1.3 but is no greater than about 1.3 times that of the monocrystalline bulk SiC wafer.

FIGS. 1 to 4 show four examples of composite and hybrid structures according to the invention. Each of the structures can be used in optical, optoelectronic or electronic applications. Each composite structure 40 includes a support wafer 20 and a monocrystalline layer 11 made of a material chosen from among monocrystalline materials.

The material(s) forming the support wafer 20 is (are) chosen mainly for its (their) high thermal conductivity properties (high thermal conductivity means conductivity significantly greater than the conductivity of monocrystalline bulk <100> silicon). The material of the support wafer 20 will be chosen from a material that has a thermal conductivity such that its thermal impedance between ambient temperature and 600° K is significantly less than or equal to 30% more than the thermal impedance of a wafer of monocrystalline bulk SiC with the same dimensions as the composite structure. In this case, monocrystalline bulk SiC is a reference in the field of thermal conductivity of crystalline materials, as its thermal conductivity is typically about 440 W/m. ° K at ambient temperature (i.e. 300° K), within ±20% depending on the quality and structure of the material. The thermal conductivity of other materials could be used as a reference, for example, the thermal conductivity of 6H—SiC (about 490 W/m. ° K), or 4H—SiC (about 370 W/m. ° K), or 3C—SiC (about 360 W/m. ° K) could be used.

The material chosen for the support wafer 20 depends on economic or cost constraints (the cost may be significantly lower than for monocrystalline bulk SiC), and availability and size constraints. In terms of size, a support wafer 20 larger than 3 inches might be required. A support wafer 20 made of polycrystalline SiC, polycrystalline AlN or a thermally adapted ceramic may also be chosen. It would also be advantageous, particularly in HEMT applications, to choose a support wafer 20 with high resistivity, meaning a resistivity of more than $10^4$ ohms-cm.

The support wafer 20 is covered by a monocrystalline layer 11, and the component material(s) for it is (are) chosen and the thickness adjusted such that the thermal impedance between ambient temperature and 600° K (which are typical operating temperatures of high power frequency components) of the complete composite structure 40 including the support wafer 20 is 1 to about 1.3 times the thermal impedance of a monocrystalline bulk SiC wafer with the same dimensions as the composite structure 40. In particular, the thickness of the monocrystalline layer 11 could be chosen to be more than a threshold thickness, below which the impedance between ambient temperature and 600° K of the composite structure would not be less than or equal to about 1.3 times the thermal impedance of a wafer made of monocrystalline bulk SiC with the same dimensions as the composite structure 40. For example, the threshold thickness may be about 0.06 μm for materials such as Si, SiGe, Ge, <111> Si or GaN. Thus, a monocrystalline layer 11 having a thickness between the threshold thickness and 1 μm could be chosen.

According to a first configuration of the composite structure 40, the monocrystalline structure 11 is designed to accommodate electronic, optical or optoelectronic components such as CMOS type transistors. In this case, the composition of the monocrystalline layer 11 may be chosen from Si, SiGe or Ge materials. In this case, the components that will be formed in the monocrystalline layer 11, or that have already been formed in the monocrystalline layer 11, will benefit from the particular structure of the composite structure 40 to dissipate the large amount of heat that will be generated by the electronic components during operation, thus reducing the risks of disturbance or even deterioration of the components.

According to a second configuration, the composite structure 40 is used to form a useful layer composed of a material capable of including components operating at a high power frequency, such as a nitride semiconductor (for example GaN). In this case, the materials chosen to form the monocrystalline layer 11 may then be SiC, or <111> Si, or GaN, or AlN or other nitride semiconductor materials. These materials are also chosen to have a high electrical resistivity (more than $10^4$ ohms-cm). When the useful layer has been formed, the composite structure 40 can then be used to dissipate large quantities of heat released by the components, particularly in the case in which these components operate at a high power frequency such as, for example, HEMT transistors.

Figure 2:
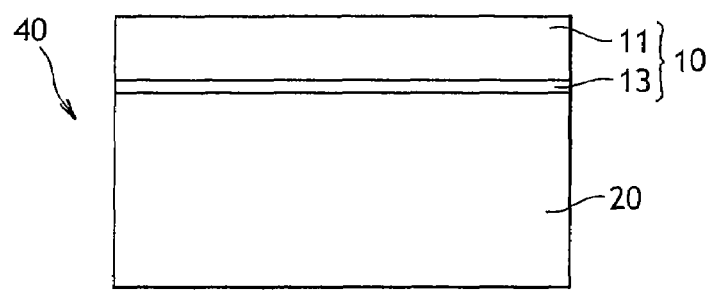
FIG. 2 shows a second composite structure according to the invention.
Figure 4:
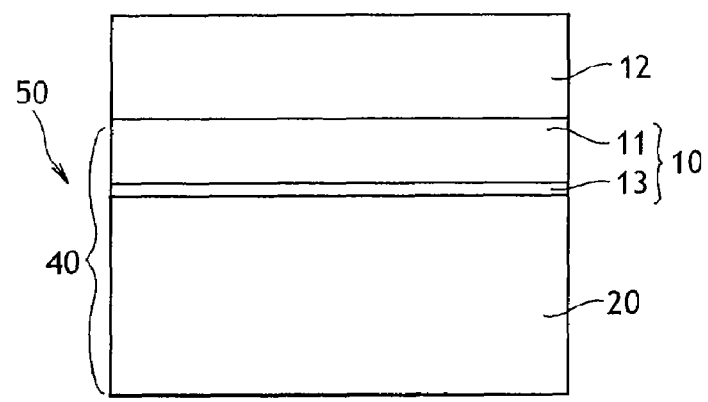
FIG. 4 shows a fourth composite structure according to the invention.

Referring to FIGS. 2 and 4, in a preferred embodiment, the layered structure 10 also comprises an insulating layer 13 made of a dielectric material. The dielectric material may be $SiO_2$ and/or $Si_3N_4$ and/or $Si_xO_yN_z$, and may be arranged at the interface with the support wafer 20. This insulation layer 13 may be particularly useful when making the composite structure 40 (as described later) because it is chosen to have interesting bonding properties when the composite structure 40 is fabricated using a bonding technique. Furthermore, the material of the insulating layer 13 can be chosen to have a large electrical resistivity, which may be an important advantage during operation of HEMT power components.

The thickness of the insulating layer 13 is chosen to be less than a threshold thickness, above which the thermal impedance between ambient temperature and 600° K of the composite structure is not less than or equal to about 1.3 times the thermal impedance of a wafer of monocrystalline bulk SiC with the same dimensions as the composite structure 40. The choice of thicknesses for the insulating layer 13 and for the monocrystalline layer 11 may be made one at a time, by using a successive approximations method. In particular, the thickness of the monocrystalline layer 11 may be adapted such that its free surface is at a given distance from the insulating layer 13. This insulating layer 13, even if it is chosen to be a thin layer, is still a thermal barrier that can cause heat dissipation problems during operation of components included within a useful layer that has been epitaxially grown on the monocrystalline layer 11. Therefore, distancing the epitaxially grown surface (i.e. the surface of the monocrystalline layer 11) from the buried insulation layer 13 improves heat dissipation.

FIG. 1 shows a first composite structure 40 in which the layered structure 10 is composed only of the monocrystalline layer 11 directly in contact with the support wafer 20. In this configuration, the main parameters that have to be chosen are the materials chosen to form the support wafer 20 and the monocrystalline layer 11, and the thickness of the monocrystalline layer 11. These parameters must be chose such that the thermal impedance between ambient temperature and 600° K of this composite structure 40 is less than or equal to 1.3 times the thermal impedance of a wafer of monocrystalline bulk SiC with the same dimensions as the composite structure 40. A monocrystalline layer 11 with a thickness of between 0.06 and 1 μm can thus be chosen.

FIG. 2 shows a second embodiment of a composite structure 40 in which the layered structure 10 is composed of a monocrystalline layer 11 and a layer of dielectric material 13 that is located between the support wafer 20 and the monocrystalline layer 11. The thickness of this insulating layer 13 is chosen to be less than a threshold thickness above which the thermal impedance between ambient temperature and 600° K of the composite structure would no longer be less than or equal to about 1.3 times the thermal impedance of a wafer of monocrystalline bulk SiC with the same dimensions as the composite structure 40. The thickness of the dielectric layer 13 is chosen after the materials for the support wafer 20 and the monocrystalline layer 11, and the thickness of the monocrystalline layer 11, have already been established. Thus, the thickness of the insulating layer 13 may be between 0.02 μm and 0.2 μm. In addition, the component material could be chosen to be $SiO_2$ and/or $Si_3N_4$ and/or $Si_xO_yN_z$ wherein x, y and z are integers between 0 and 5. Once this is known a monocrystalline layer 11 with a thickness of between 0.06 and 1 μm can be chosen. For example, a composite structure 40 having a support wafer 20 made of polycrystalline SiC, a layer of monocrystalline material 11 made of <111> Si having a thickness chosen to be between 0.2 and 1.0 micrometers, and a dielectric material layer (13) made of $SiO_2$ and having a thickness of about 0.20 micrometers, would be possible. Another example of a possible composite structure 40 includes a support wafer 20 made of polycrystalline SiC, a layer of monocrystalline material 11 made of <111> Si having a thickness chosen to be between 0.06 and 1.0 micrometers, and a dielectric material layer (13) made of SiO2 and having a thickness of about 0.05 micrometers.

Figure 3:
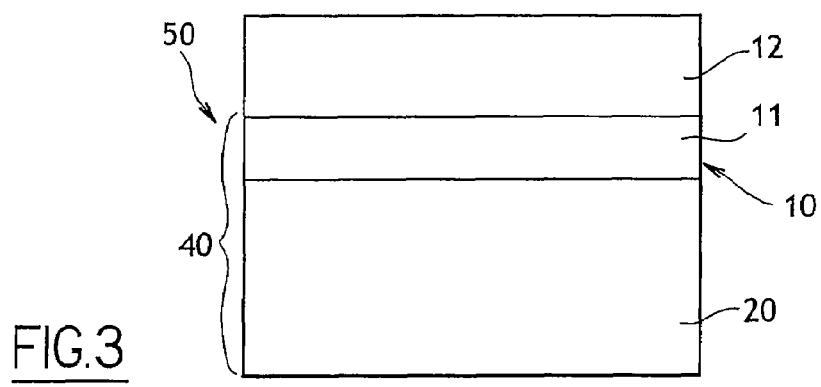
FIG. 3 shows a third composite structure according to the invention.

FIGS. 3 and 4 illustrate two different hybrid structures 50. A hybrid structure is made by adding an upper structure 12 to the layered structure 10 on the monocrystalline layer 11. The material(s) forming this upper structure 12 are chosen to improve the quality of a layer of crystalline material to be formed on the hybrid structure 50. Therefore, these hybrid structures 50 are particularly well-arranged for acting as a substrate for the crystalline growth of a useful layer made of a material adapted to high power frequencies, such as a nitride semiconductor made from a material like GaN. In this case, the nature and configuration of the upper structure 12 are chosen to improve the quality of the useful layer that will be formed thereon, in comparison to the case in which the useful layer is formed directly on the monocrystalline layer 11. Thus, a lattice parameter starting from the composite structure 40 is chosen that is close to the lattice parameter of the useful layer to be formed (this avoids creating an excessive density of dislocations, and results in a useful layer that would be constrained to resist excessive lattice mismatches with its growth support). For example, an upper structure 12 could be chosen that has similar or equivalent buffer structures as those described in U.S. published application no. 2003/136333 and U.S. Pat. No. 6,617, 060, namely an upper structure 12 comprising at least one layer made of $Al_xIn_yGa_{(1-x-y)}N$, or $In_xGa_{1-y}N$, or $Al_xGa_{1-x}N$ (where x is between 0 and 1 and y is between 0 and 1), with a layer with a composition that does not vary within its thickness and/or a layer with a composition that varies progressively within the thickness according to the most technically and economically attractive configurations. This upper structure 12, made so that a high quality useful layer can be formed thereon, also distances the useful layer further away from the interface with the support wafer 20, which is advantageous in the case (see FIG. 4) in which an insulating layer 13 is interfaced with the support wafer 20 (because the insulating layer 13 may retard the dissipation of heat if it has a thickness greater than a threshold thickness).

Figure 5A:
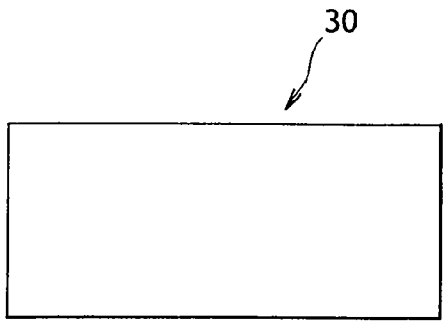
FIGS. 5a to 5e show steps in a method of fabricating a composite structure according to the invention.

The steps of a process for manufacturing a composite structure 40 are shown in FIGS. 5a to 5e. In particular, FIG. 5a shows a donor wafer 30 that is composed of a monocrystalline material. According to a first configuration, the donor wafer 30 may be made of a monocrystalline bulk material. If a composite structure 40 is to be made for a CMOS type application, a donor wafer 30 made of <100> Si or monocrystalline bulk Ge could be chosen. Alternately, if a composite structure 40 will be used as a substrate for crystalline growth of a subsequent layer made of nitride semi-conductor, a monocrystalline SiC or monocrystalline <111> Si material could be chosen. According to a second configuration, the donor wafer 30 initially comprises a growth substrate adapted to growth of a layer of monocrystalline material that will be transferred. This growth substrate typically includes a support made of a monocrystalline bulk material. Thus, a growth substrate made of sapphire ($Al_2O_3$), SiC, bulk ZnO or monocrystalline bulk <111> Si could be used, and a layer made of an SiC, <111> Si, GaN, AlN, InN, $Al_xIn_yGa_{(1-x-y)}$, $In_yGa_{(1-y)}N$, or $Al_xGa_{1-x}N$ monocrystalline material layer, where $0 \leq x \leq 1$ and $0 \leq y \leq 1$ could be formed thereon. This growth substrate may further comprise an intermediate structure between the support and the layer made of a monocrystalline material to be transferred. The intermediate structure can act as a buffer structure, and may be arranged to compensate for differences of thermal expansion and/or differences in the lattice parameters and/or to confine defects. For example, a monocrystalline layer made of <100> Si, or relaxed SiGe could be utilized. The monocrystalline layer could be formed by crystalline growth on a buffer layer made of SiGe, and the composition of the buffer layer may vary progressively through its thickness starting from a support made of <100> Si or monocrystalline bulk Ge.

Figure 5B:
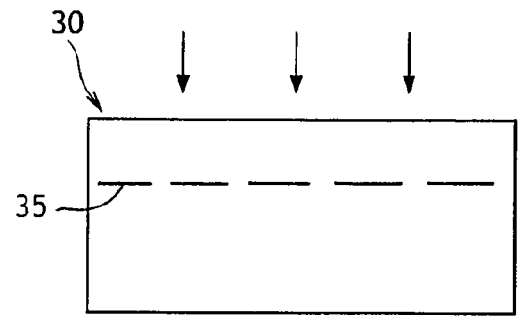

Referring to FIG. 5b, the donor wafer 20 is then implanted with atomic species according to predetermined dosing and energy conditions to form a zone of weakness 35 at a predetermined depth in the donor wafer 30. For example, atomic species such as hydrogen ions could be implanted at an energy of between about 10 and about 200 keV, and wherein the atomic species having between $5 \times 10^{16}$ and $8 \times 10^{16}$ atoms per square centimeter. The depth of the zone of weakness 35 is chosen to define a material thickness (between the zone of weakness 35 and the surface of the donor wafer 30 that will be bonded to a support wafer 40 according to the step shown on FIG. 5c) that includes at least part of the layered structure (not shown) to be transferred onto the support wafer 20. In particular, implantation occurs so that the layered structure thus delimited includes a monocrystalline material in the form of a layer, and the nature and thickness of each layer is such that the thermal impedance between ambient temperature and 600° K of the composite structure 40 that is formed (including this layered structure after transfer to the support wafer 20) is less than or equal to 1.3 times the thermal impedance of monocrystalline bulk SiC. Optionally, an insulating layer 13 may be formed on the surface before or after the implantation of atomic species. For example, the insulating layer 13 may be an oxide ($SiO_2$) and/or a nitride ($Si_3N_4$ and/or $Si_xO_yN_z$ wherein x, y and z are integers between 0 and 5) with a thickness such that the thermal impedance between ambient temperature and 600° K of the composite structure 40 to be formed (see FIG. 5e) is less than or equal to about 1.3 times the thermal impedance of monocrystalline bulk SiC. For example, a layer of $SiO_2$ and/or $Si_3N_4$ and/or $Si_xO_yN_z$ could be formed with a thickness varying from 0.02 μm to 0.2 μ

The bonding surface (i.e. the surface through which implantation was accomplished) of the donor wafer 30 may then be optionally prepared for bonding. For example, it may be cleaned to eliminate contaminants (such as metallic, particulate, or hydrocarbon elements) and to make the surface more hydrophilic. Processes such as mechanical-chemical polishing, plasma activated cleaning and the like could be used. Optionally, if an insulating layer 13 was formed on the implantation surface, the insulating layer may be completely removed during a cleaning step.

Figure 5C:
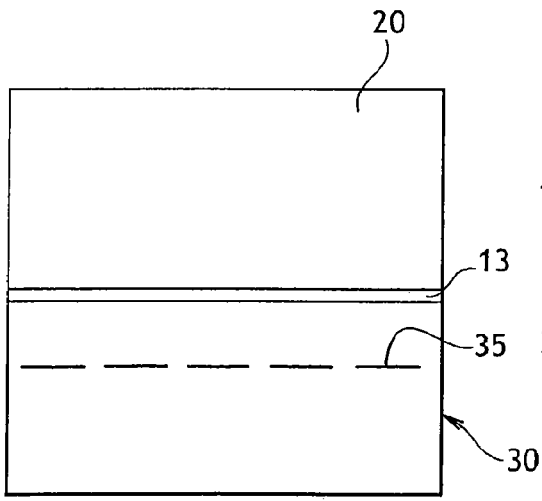

FIG. 5c depicts a support wafer 20 contacting or bonded to the donor wafer 30 at the implantation surface. Preferably, an insulating layer was previously formed on the surface of the support wafer 20. In any case, the thickness of the insulating layer 13 between the support wafer 20 and the donor wafer 30 is chosen so as not to form an excessive thermal barrier to heat dissipation. Thus, the thickness of the wafer is chosen such that the thermal impedance between ambient temperature and 600° K of the composite structure 40 that will be formed (see FIG. 5e) is less than or equal to about 1.3 times the thermal impedance of a wafer of monocrystalline bulk SiC with the same dimensions as the composite structure 40.

Before bonding the support wafer 20 and the donor wafer 30, the bonding surface of the support wafer 20 was prepared, for example, by applying cleaning treatments to make it more hydrophilic and/or to remove contaminants. Optionally, the two bonding surfaces could be prepared using other processes, such as CMP (Mechanical-Chemical Planarization) or by using plasma activation in order to improve the bonding energy. The prepared bonding surfaces of the donor wafer 30 and the support wafer 20 may then be brought into contact at ambient temperature.

Figure 5D:
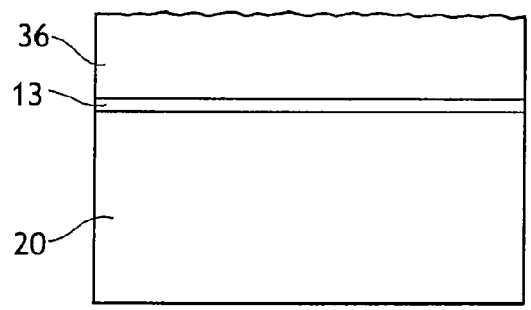

Once the two substrates have been bonded, the bond can be reinforced by adding thermal energy, for example, by baking the structure at more than about 200° C. for about 2 hours. With reference to FIG. 5d, energy is then added so that the weak bonds located at the zone of weakness 35 will break to detach the remainder structure 36. The remainder structure 36 then remains bonded to the support wafer 20.

This remainder structure 36 includes at least a portion of the layered structure 10 to be formed on the support wafer 40. The energy supplied may be thermal and/or mechanical, and one layer transfer technique known to those skilled in the art is called SMART-CUT®, and is described in "Silicon-On-Insulator technology: Material to LVSI, $2^{nd}$ edition" by J-P Colinge (Kluwer Academic Publishers, pgs. 50 and 51).

According to one variant of the process, the donor wafer 30 shown in FIG. 5c can be processed using a technique other than SMART-CUT®. In this case, the steps preceding bonding and the bonding step are the same as those described above, except that implantation (shown in FIG. 5b) does not occur. Other techniques for processing or reducing the size of the donor wafer 30 as shown in FIG. 5c include mechanical thinning (such as polishing or lapping) and/or dry chemical etching on the back face of the wafer until a predetermined thickness is reached, which may be a few tens of microns. In addition, different mechanical-chemical polishing steps can be used to thin the donor wafer 30 to leave a remainder structure 36 like that shown in FIG. 5d. Regardless of the technique used for reducing the donor wafer 30, a surface finishing step is applied to the remainder structure 36 in order to remove any roughness and contaminants on the surface.

The detachment surface may be prepared to become an "epi-ready" surface (which means that it is ready to receive epitaxial elements). For example, a CMP and/or wet or dry chemical etching process (for example by RIE plasma) could be used.

Techniques for selectively removing material, such as a selective chemical etching, could also be used. A stop layer could be provided in the remainder structure 36 for such selective material removal. Optionally, the stop layer could then be removed to obtain a final layered structure 10 having good surface quality with little roughness (see FIG. 5e).

Figure 5E:
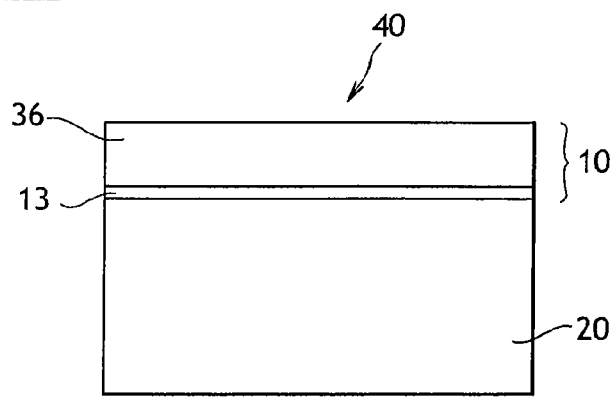

FIG. 5e shows the final result, which is a composite structure 40 including a layered structure 10 that includes the remainder structure 36 and possibly an insulating layer 13 (according to the composite structure 40 shown in FIG. 1 or 2). After transfer of the remainder layer 36 from the donor wafer 30 onto the support wafer 20, crystalline growth of a monocrystalline upper structure 12 on the layered structure 10 may be applied to obtain one of the hybrid structures 50 shown in FIGS. 3 and 4.

Comparative studies were conducted for composite structures including a support wafer 20 made of polycrystalline SiC, and a layered structure 10 composed of a monocrystalline layer 11 made of <111> silicon and an insulating layer 13 made of $SiO_2$. In this case, the resistivity of the support wafer 20 made of polycrystalline SiC was greater than $10^5$ Ohm/cm. These composite structures 30 were made using the SMART-CUT® process (the main steps of which were described above with reference to FIGS. 5a to 5e). A simulation of the thermal behavior of such a composite structure 40 was made, wherein a GaN layer including HEMT components were included and operated, and compared to other types of supports having the same layer of GaN. One purpose of this study was to determine how the temperature in the GaN layer is influenced by different parameters such as the thickness of the insulating layer 13, the thickness of the monocrystalline layer 11, the nature of the support wafer 20, and the power dissipated by HEMT components. The results are given in FIGS. 6 and 7.

Figure 6:
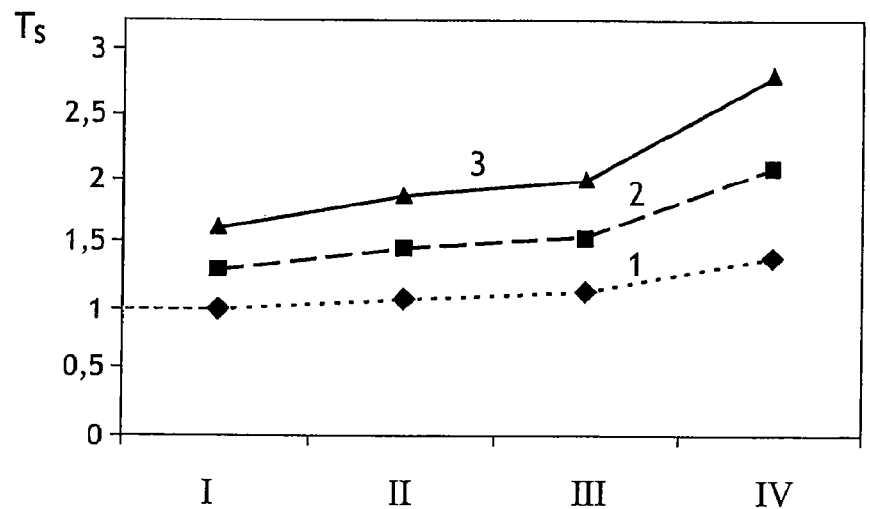
FIGS. 6 and 7 are graphs showing results of simulations of thermal behavior conducted on different GaN supports, including a composite structure according to the invention.

FIG. 6 is a graph showing the estimated surface temperature Ts (normalized in the figure) at the component (i.e. under the component grid) which depends on the support type chosen for the GaN layer. Thus, the support I is made of monocrystalline bulk SiC, the support II is made of polycrystalline bulk SiC, the support III is made of <111> Si/SiO2/polycrystalline bulk SiC, and the support IV is a support made of monocrystalline bulk <111> Si. All these supports (I, II, III, IV) had the same dimensions.

Curve 1 (dotted lines) is the case having an applied power of 5 W/mm, curve 2 (dashed lines) is the case in which the applied power is 10 W/mm, curve 3 (continuous lines) is the case in which the applied power is 15 W/mm. These power values correspond to those typically dissipated by a power component.

The composite structure 40 according to the invention (represented as configuration III on the graph) includes a layered structure 10 made of a 2 μm thick monocrystalline layer made of <111> Si and a 1 μm thick insulating layer 13 made of $SiO_2$. The results of this simulation show that a composite structure 40 according to the invention is able to dissipate much more heat (on the order of 20 to 30%) than the support IV made of monocrystalline bulk silicon, and is only on the order of 10 to 20% less efficient at dissipating heat than a support I made of monocrystalline bulk SiC. The difference is even lower compared with a support II made of polycrystalline bulk SiC (depending on the powers applied to the useful layer of GaN). Therefore, the temperature increase of a component in the GaN layer in the simulated composite structure is approximately the same as the temperature increase obtained on a monocrystalline bulk SiC substrate. These results implied a composite structure with a thermal impedance between ambient temperature and 600° K less than or equal to 1.3 times the thermal impedance of a monocrystalline bulk SiC wafer with the same dimensions as the composite structure 40. Even if the thermal impedance seems a little higher than the thermal impedance of an equivalent monocrystalline bulk SiC, or for that of a polycrystalline bulk SiC, it is satisfactory for the operation of an HEMT transistor in GaN layers with high power frequencies. Moreover, the composite structure 40 enables epitaxial growth of high quality GaN layers, unlike a support II made of polycrystalline SiC. Furthermore, economically the composite structure 40 is much more attractive than a support I made of monocrystalline SiC.

Figure 7:
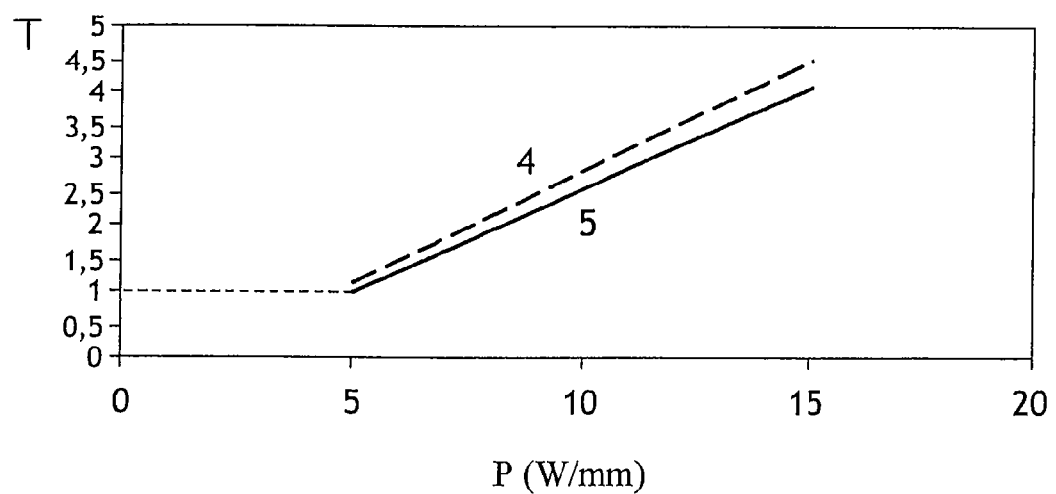

FIG. 7 is a simulation of the maximum temperature T (normalized) of a GaN layer when increasing power values are applied to it (shown on the abscissa). In this case, the useful layer of GaN was formed on a composite structure 40 that includes a polycrystalline SiC support wafer and a 2 μm thick monocrystalline layer of <111> Si. This graph compares the cases of a composite structure 40 that includes a 1 μm thick $SiO_2$ insulating layer (curve 4) to a composite structure 40 without such an insulating layer (curve 5). The results of this simulation show that a thin insulating layer (less than 1 μm thick) does not significantly modify the thermal dissipation properties of the composite structure 40 (the change is on the order of about 0% for a power of 5 W/mm to about 5% for a power of 15 W/mm). It has thus been demonstrated that a composite structure 40 can include an insulating layer 13 without significantly attenuating its thermal dissipation properties.

What is claimed is:

1. A composite structure, comprising:
a support wafer; and
a layered structure on the support wafer, the layered structure including at least one layer of a monocrystalline material and at least one layer of a dielectric material,
wherein the layered structure materials and the thickness of each layer are chosen such that the thermal impedance between ambient temperature and 600° K of the composite structure is a value that is no greater than about 1.3 times the thermal impedance of a monocrystalline bulk SiC wafer having the same dimensions as the composite structure, to provide sufficient heat dissipation properties to allow use of the composite structure for manufacturing optical, electronic, or optoelectronic components.

2. The structure of claim 1, wherein the support wafer material has a significantly lower thermal impedance than the thermal impedance of monocrystalline bulk silicon and has an electrical resistivity of more than about $10^4$ ohms-cm.

3. The structure of claim 2, wherein the support wafer is made of at least one of polycrystalline bulk SiC, polycrystalline bulk AlN, or a ceramic material.

4. The structure of claim 1, wherein the layered structure includes at least one layer of a dielectric material of $SiO_2$, $Si_3N_4$, or $Si_xO_yN_z$.

5. The structure of claim 1, wherein the layered structure includes at least one layer of a monocrystalline material and at least one layer of a dielectric material, wherein the dielectric material has a maximum thickness of about 0.2 micrometer, and wherein the monocrystalline material layer has a thickness above a threshold thickness which is a function of the dielectric material layer thickness.

6. The structure of claim 1, wherein the dielectric material has a thickness of about 0.02 to 0.2 micrometer, and the monocrystalline material layer has a threshold thickness of from about 0.06 to 1 micrometer.

7. The structure of claim 6, wherein the support wafer is made of polycrystalline SiC, the monocrystalline material layer is made of <111> Si and the dielectric material layer is made of $SiO_2$.

8. The structure of claim 1, wherein the monocrystalline layer material is a semiconductor material suitable for fabricating at least one electronic component formed therein or comprises at least one CMOS type electronic component and the monocrystalline material is at least one of Si, SiGe, or Ge.

9. The structure of claim 1, wherein the substrate has an electrical resistivity of more than about $10^4$ ohms-cm and the material of the monocrystalline material layer comprises at least one of SiC, <111> Si, or GaN and accommodates growth of a monocrystalline nitride semiconductor thereon.

10. The structure of claim 1, which further comprises an epitaxial layer made of monocrystalline GaN suitable for use in HEMT applications.

11. The structure of claim 1, which includes at least one layer of $SiO_2$ having a thickness between about 0.2 micrometer and 1 micrometer.

12. A hybrid structure suitable for use as a substrate for the crystalline growth of a nitride semiconductor, comprising:
   a support wafer;
   a layered structure on the support wafer to form a composite structure, the layered structure including at least one monocrystalline material layer and at least one dielectric material layer, and wherein the layered structure materials and the thickness of each material layer are chosen such that the thermal impedance between ambient temperature and 600° K of the composite structure is no greater than about 1.3 times the thermal impedance of a monocrystalline bulk SiC wafer with the same dimensions as the composite structure; and
   a monocrystalline upper structure formed on a free surface of the monocrystalline material layer, wherein the material of the upper structure is suitable for forming a high quality nitride semiconductor layer thereon.

13. The hybrid structure of claim 12, wherein the layered structure includes at least one layer of a monocrystalline material made of at least one of SiC, <111> Si, or GaN, and wherein the upper structure comprises a layer made of at least one of the following alloys: $Al_xIn_yGa_{(1-x-y)}N$, or $In_yGa_{(1-y)}N$, or $Al_xGa_{(1-x)}N$ where $0 \leq x \leq 1$ and $0 \leq y \leq 1$.

14. The hybrid structure of claim 13, wherein the concentration of at least one of the alloy elements of the material of the upper structure varies progressively through the thickness of the monocrystalline material.

15. The hybrid structure of claim 12, which further comprises an epitaxial layer made of monocrystalline GaN suitable for use in HEMT applications.

16. The hybrid structure of claim 12, wherein the layered structure includes at least one layer of $SiO_2$ having a thickness between about 0.2 micrometer and 1 micrometer.

* * * * *